(12) United States Patent
Kang et al.

(10) Patent No.: US 7,852,659 B2
(45) Date of Patent: Dec. 14, 2010

(54) TIME EFFICIENT PHASE CHANGE MEMORY DATA STORAGE DEVICE

(75) Inventors: Hee Bok Kang, Chungcheongbuk-do (KR); Suk Kyoung Hong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 71 days.

(21) Appl. No.: 12/147,634

(22) Filed: Jun. 27, 2008

(65) Prior Publication Data
US 2009/0040818 A1 Feb. 12, 2009

(30) Foreign Application Priority Data
Aug. 10, 2007 (KR) .............. 10-2007-0080660

(51) Int. Cl.
*G11C 11/00* (2006.01)
(52) U.S. Cl. ............. 365/148; 365/163; 365/189.04
(58) Field of Classification Search ........... 365/148, 365/163
See application file for complete search history.

(56) References Cited
U.S. PATENT DOCUMENTS
5,546,341 A * 8/1996 Suh et al. ............ 365/185.33
6,829,673 B2 * 12/2004 Lee et al. ............ 711/103
2004/0130949 A1 * 7/2004 Rolandi .............. 365/185.12
2006/0190672 A1 * 8/2006 Fuji ..................... 711/100

FOREIGN PATENT DOCUMENTS
| JP | 7-93215 A | 4/1995 |
| KR | 2004-0095619 A | 11/2004 |
| KR | 1020050011409 A | 1/2005 |
| KR | 1020050086588 A | 8/2005 |

* cited by examiner

*Primary Examiner*—Amir Zarabian
*Assistant Examiner*—Anthan T Tran
(74) *Attorney, Agent, or Firm*—Ladas & Parry LLP

(57) ABSTRACT

A phase change memory device is presented that includes a phase change resistance cell array and a cache register. The phase change resistance cell array includes a phase change resistor configured to sense crystallization changed depending on currents so as to store data corresponding to resistance change. The cache register is configured to store a plurality of data applied externally depending on a register write command and to simultaneously output the plurality of data to the phase change resistance cell array depending on a cell write command.

15 Claims, 13 Drawing Sheets

TIME EFFICIENT PHASE CHANGE MEMORY DATA STORAGE DEVICE

CROSS-REFERENCES TO RELATED APPLICATIONS

This application is based upon and claims the benefit of priority to Korean Patent Application No. 10-2007-80660, filed on Aug. 10, 2007, the entire contents of which are incorporated herein by reference.

BACKGROUND OF THE INVENTION

The present invention relates generally to a phase change memory device, and more particularly, to a technique of simultaneously writing a plurality of byte-wide data in order to reduce the total amount of writing time.

Some well known nonvolatile memory components include magnetic memory components and phase change memory (PCM) designs. The PCM components can exhibit data processing speeds similar to that of volatile Random Access Memory (RAM) components. Further PCM components enjoy the advantage of being able to conserve data even after the power is turned off.

FIGS. 1a and 1b are diagrams illustrating a conventional phase change resistor (PCR) 4.

The conventional PCR 4 comprises a phase change material (PCM) 2 inserted between a top electrode 1 and a bottom electrode 3. When a voltage and a current are imposed across the top and bottom electrodes (1,3), the temperature is raised in the PCM 2, which results in altering the electric conductive properties, and thereby the resistance changes as a function of the state of the PCM 2.

The PCM 2 can include any number of different materials, such as AgLnSbTe. The PCM 2 often times includes a chalcogenide having at least one of the chalcogen elements (S, Se, Te) as a main ingredient, and containing other ingredients such as germanium and antimony. One PCM 2 of interest is the germanium antimonic tellurium consisting of Ge—Sb—Te ($Ge_2Sb_2Te_5$).

FIGS. 2a and 2b are diagrams illustrating a principle of the conventional PCR 4.

As shown in FIG. 2a, the PCM 2 can maintain its crystalline morphology when a relatively low current of less than a threshold value flows through the PCM 4. As a result, of the highly ordered crystalline morphology of the PCM 2, the crystalline PCM 2 exhibits a relatively low resistance.

As shown in FIG. 2b, the crystalline morphology of the PCM 2 can be induced to melt when a current of more than a threshold value is imposed across the PCR 4. As a result of raising the temperature above the crystalline melting temperature coupled with cooling the melted PCM 2 relatively rapidly, the crystalline morphology of the PCM 2 can be transformed into an alternate solid amorphous morphology. It is thought that because of the increased number or increased density of crystal imperfections in these amorphous states, the amorphous PCM 2 exhibits a higher electrical resistance as compared to the crystalline PCM 2.

Accordingly, one can exploit this difference in physical properties by designing a PCR 4 to be configured to store nonvolatile data corresponding to the two resistance states. One could arbitrarily assign a data "1" state to refer to when the PCR 4 exhibits a relatively low resistance state. Likewise, one could arbitrarily assign a data "0" state to refer to when the PCR 4 exhibits a relatively high resistance state. Accordingly, binary logic states can be stored in these types of PCM devices without the need for powering these devices.

When heat is generated from an electrical current flowing is across the top electrode 1 and the bottom electrode 3 of the PCR 4, the solid state morphology of the PCM 2 can be transformed from crystalline to an amorphous state if the heat raises the temperature above the melting point and if the subsequent cooling step is performed rapidly.

In contrast, when heat is generated from an low amount of electrical current flowing across the top electrode 1 and the bottom electrode 3 of the PCR 4, the solid state morphology of the PCM 2 in the crystalline state can be maintained. As long as the current is relatively low so that the resultant temperature never rises above the melting point then the PCM can be maintained in a crystalline state. As mentioned above, when the PCR 4 is in a crystalline state it exhibits a relatively lower resistance which can be arbitrarily defined to be a set state. On the other hand, when a high electrical current flows across the top electrode 1 and the bottom electrode 3 of the PCR 4, the PCM can be transformed into an amorphous state from the heating and from the rapid cooling. As a consequence when the PCR 4 is in the amorphous state it exhibits a relatively higher resistance which can be arbitrarily defined as a reset state. A physical property difference between these two morphological phases is the change in the electric resistance.

A low voltage is applied to the PCR 4 for a long time in order to allow the PCM 2 to transform into the crystalline state and thus write the set state in a write mode. On the other hand, a high voltage is applied to the PCR 4 for a short time in order to allow the melted PCM 2 to anneal into the amorphous state and thus write the reset state in the write mode.

In the operation of conventional phase change memory devices, when a write cycle is initiated, new data is always written regardless of what data, i.e., regardless of what solid state the PCM 2 is at, resides in the selected phase change resistor PCR 4.

FIGS. 3 and 4 are diagrams illustrating a write cycle of a conventional phase change memory device.

During a write cycle (1), one byte-width data is written in a phase change resistor PCR 4 after a first write command is received. During an nth write cycle, one byte width data is written in the phase change resistor PCR 4 after an nth write command is received.

Heat is generated when a current flows between the top electrode 1 and the bottom electrode 3 of the PCR 4 for a given time. As a result, a state of the PCM 2 can be changed to be either crystalline or amorphous depending on temperature and the annealing step applied at the top electrode 1 and the bottom electrode 3.

When a low current flows for a given time, the PCM 2 solid state morphology can be transformed into a crystalline morphology as a result of a low temperature heating state and consequently a slow annealing so that the PCR 4 results in producing a low resistor at a set state. On the other hand, when a high current flows for a given time, the solid state morphology of the PCM 2 can be transformed into an amorphous solid state morphology as a result of the induced high temperature heating state coupled with an abrupt annealing so that the PCR 4 results in producing a high resistor which could then be arbitrarily assigned to be a reset state. Accordingly, this difference between these two different solid state morphologies, i.e., crystalline and amorphous morphological solid state phases, represents a controllable electric resistance change.

A low voltage is applied to the PCR 4 for a relatively long time period in order to gently drive the phase transition between the solid and liquid state and to provide a relatively gentle annealing condition that results in forming a crystalline solid state morphology in the PCM 2 which thereby writes the set state in a write mode. On the other hand, a high voltage is applied to the PCR 4 for a relatively short time period in order to drive the phase transistion between the solid and liquid states and to provide an abrupt annealing condition that results in forming an amorphous solid state morphology in the PCM 2 which thereby writes the reset state in the write mode.

In the conventional phase change memory device, when a write cycle starts, new data is always written unconditionally in the selected phase change resistor PCR 4. As a result, conventional phase change memory devices require a considerable amount of time and energy to set/reset the data in the cells.

During a single write cycle, writing data one byte wide is always written in the phase change resistor PCR depending on a write command. As a result, a considerable amount of time is needed to write data having one byte-width in the phase change resistor PCR is required using conventional phase change memory devices.

SUMMARY OF THE INVENTION

Various embodiments are directed at simultaneously writing a plurality of byte wide data in cells to reduce the requisite write operating time.

Various embodiments are directed at separating a register write command from a cell write command to adjust a byte-width of data that can be written simultaneously, thereby improving the efficiency of the system.

According to an embodiment of the present invention, a phase change memory device comprises: a phase change resistance cell array comprising a phase change resistor configured to sense a change in crystallization as a function of applied currents so as to store data corresponding to resistance change; and a cache register configured to store a plurality of data applied externally as a function of a register write command and configured to simultaneously output the plurality of data to the phase change resistance cell array as a function of a cell write command.

DESCRIPTION OF SPECIFIC EMBODIMENTS

Figure 1A:
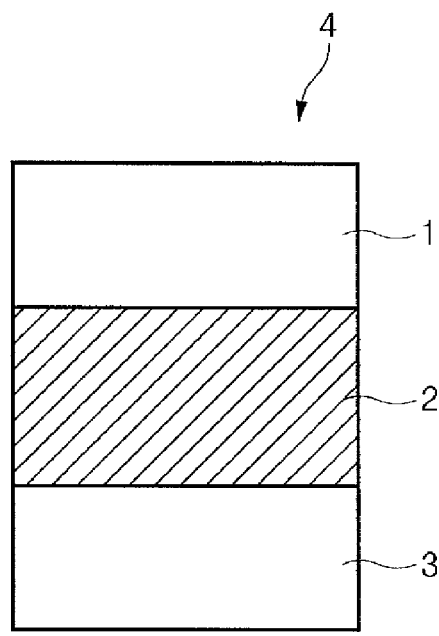
FIGS. 1a and 1b are diagrams illustrating a conventional phase change resistor.
Figure 1B:
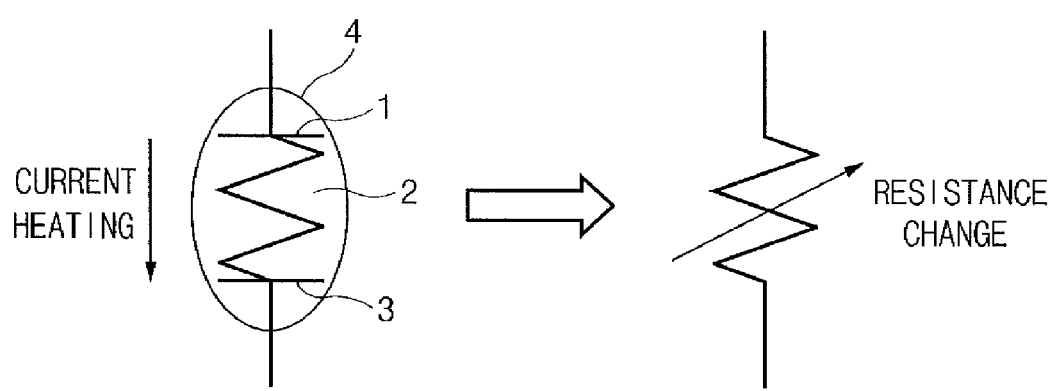
Figure 2A:
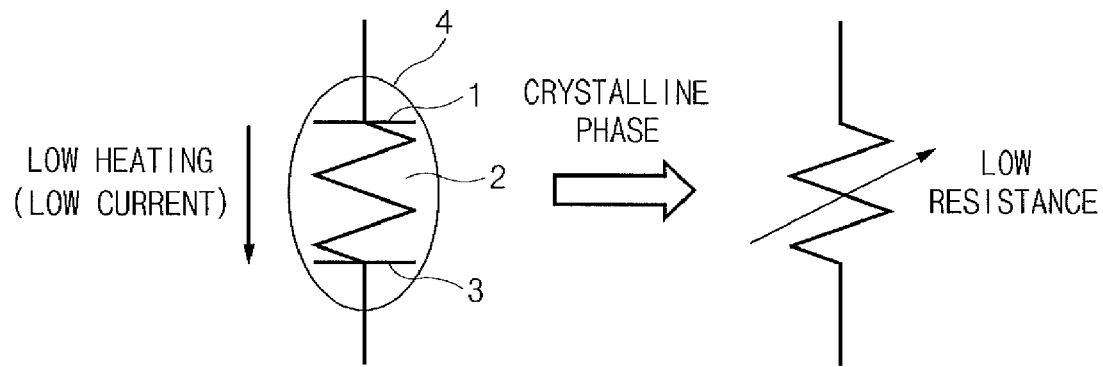
FIGS. 2a and 2b are diagrams illustrating a principle of the conventional phase change resistor.
Figure 2B:
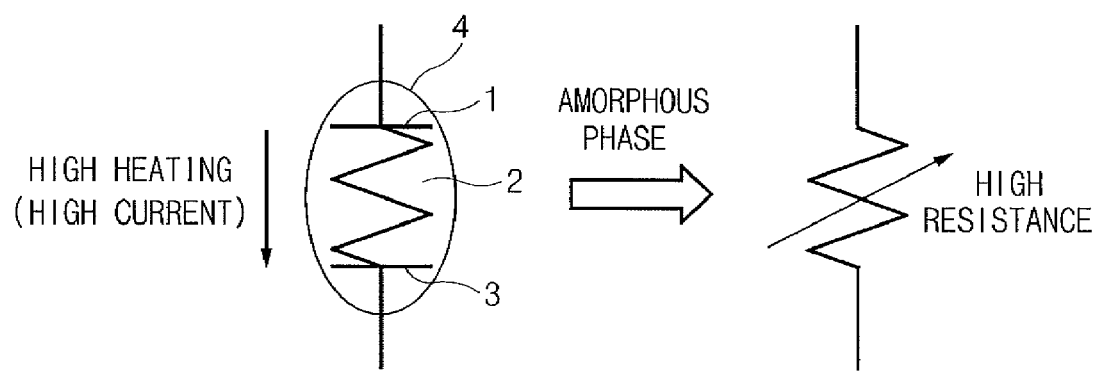
Figure 3:
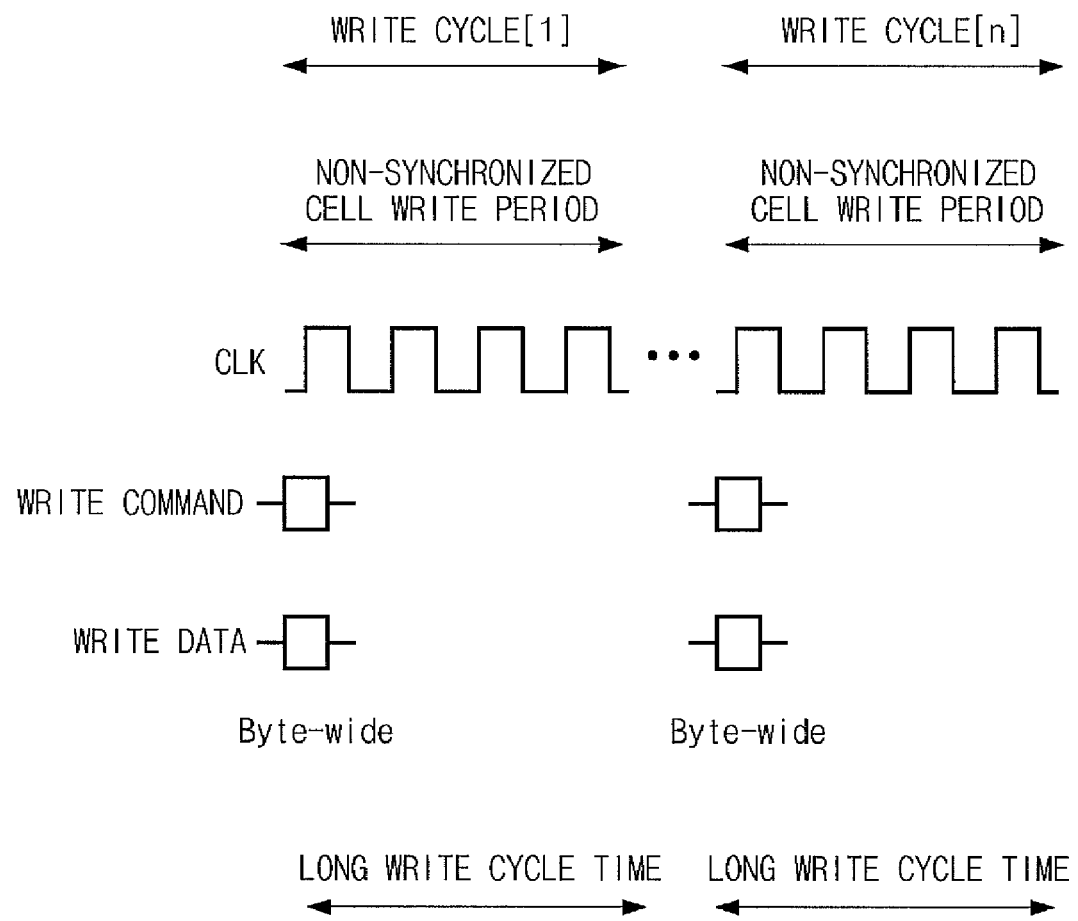
FIGS. 3 and 4 are diagrams illustrating a write cycle of a conventional phase change memory device.
Figure 4:
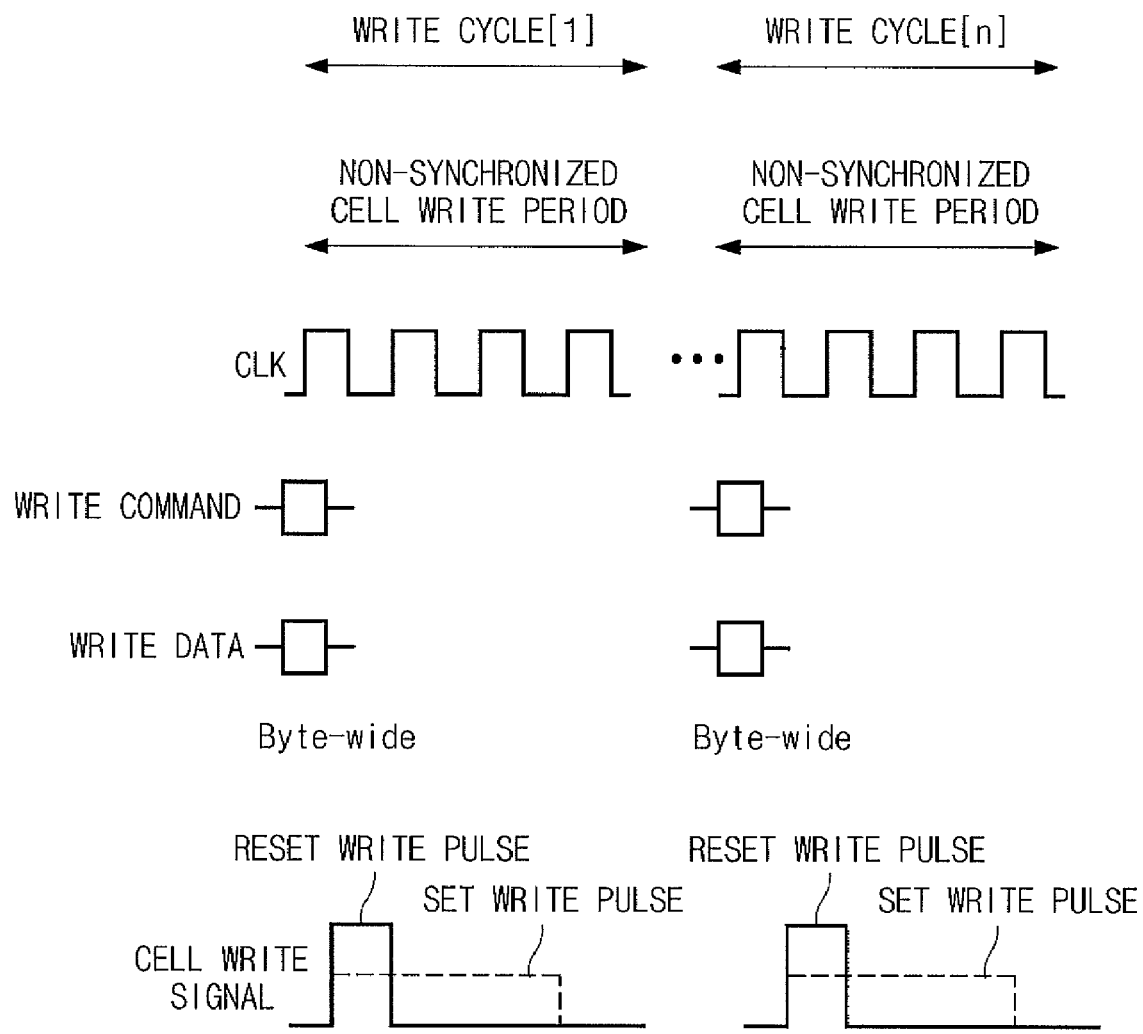
Figure 5:
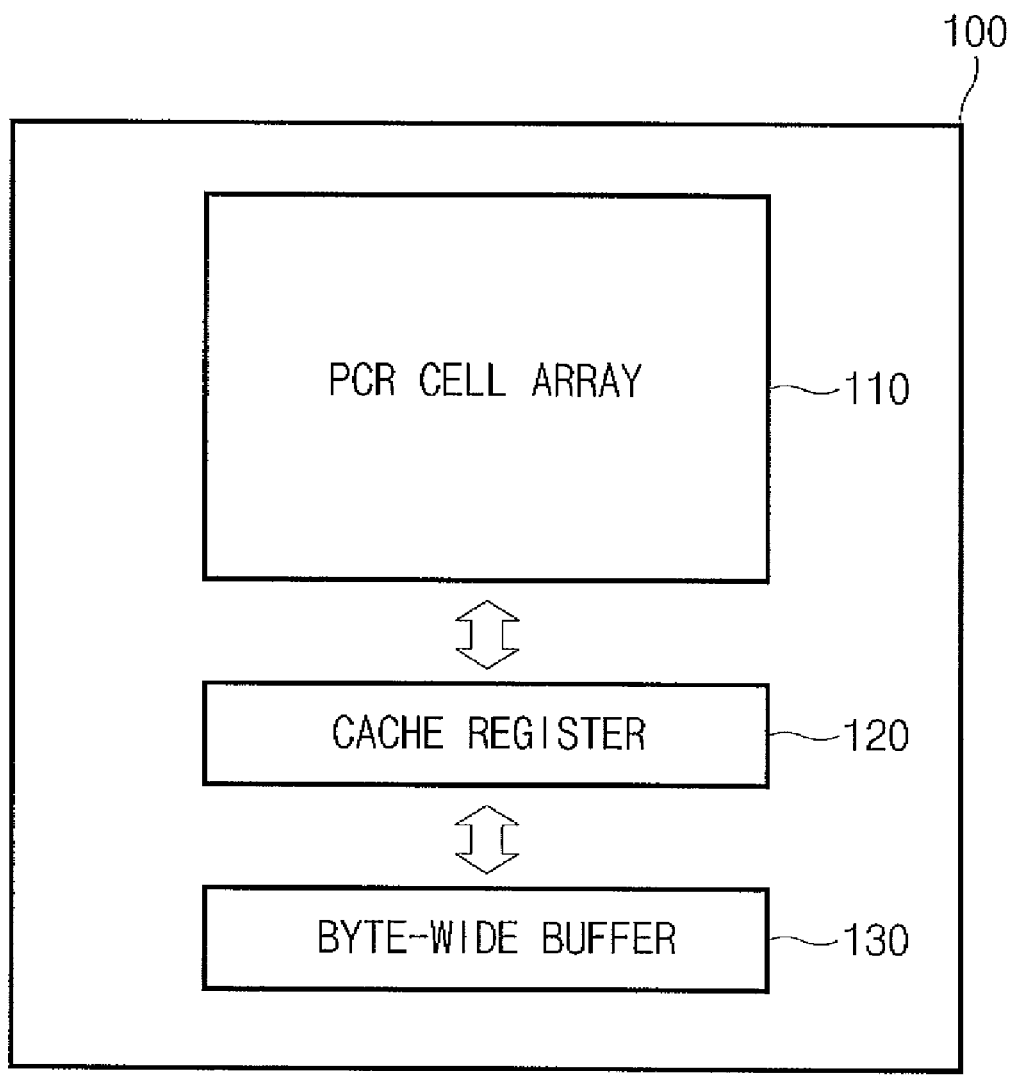
FIG. 5 is a diagram illustrating a phase change memory device according to an embodiment of the present invention.
Figure 6:
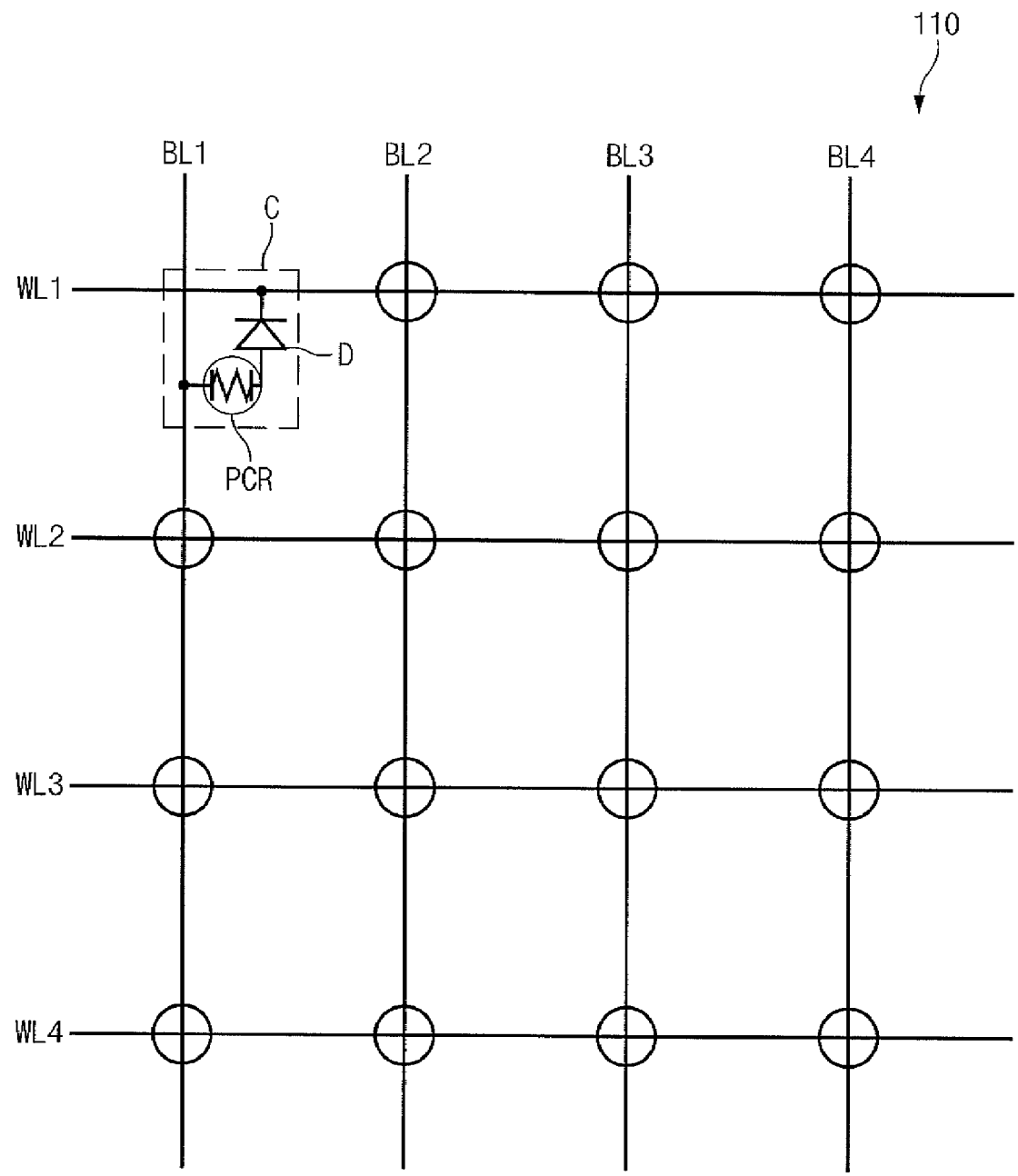
FIG. 6 is a detailed diagram illustrating a phase change resistance cell array of FIG. 5.

FIG. 5 is a diagram illustrating a phase change memory device according to an embodiment of the present invention. FIG. 6 is a detailed diagram illustrating a phase change resistance cell array 110 of FIG. 5.

The phase change memory device of FIG. 5 comprises a phase change resistance (PCR) cell array 110, a cache register 120 and a byte-wide buffer 130 in a chip 100.

The PCR cell array 110 includes a plurality of bit lines BL1~BL4 arranged in a row (i.e., horizontal) direction and a plurality of word lines WL1~WL4 arranged in a column (i.e., vertical) direction. The cell array 110 includes a plurality of unit cells C arranged at intersections of the bit lines BL1~BL4 and the word lines WL1~WL4. Each unit cell C includes a phase change resistor PCR and a PN diode D.

Each phase change resistor PCR has one terminal connected to a corresponding bit line BL and the other terminal connected to a corresponding P-type region of the PN diode D. The PN diode D has a N-type region connected to a corresponding word line WL.

A relatively low voltage is applied to the selected word line WL when in a read mode. A read voltage Vread is applied to the bit line BL so that a read current, corresponding to having either a set state or a read current having a reset state, flows toward the word line WL through the bit line BL, the phase change resistor PCR and the diode D.

The cache register 120 is configured to temporarily store a plurality of byte wide data which are applied from the outside or the byte-wide buffer 130 in a corresponding write region.

The cache register 120 receives a register write command RWC, a cell write command CWC and a column address Yadd. The register write command RWC is a command signal used for storing byte-wide data in the cache register 120. The cell write command CWC is a command signal used for transmitting the data stored in the cache register 120 to the bit line BL.

The byte-wide buffer 130 buffers an external signal in a write mode to transmit the external signal to the inside of the chip 100. The byte-wide buffer 130 buffers a signal of the chip 100 in a read mode to transmit the signal to the outside of the chip 100.

The byte-wide buffer 130 transmits data having a byte width when the byte-wide buffer transmits and receives a signal with the outside. The byte-wide buffer 130 performs a buffer operation in response to the register write command RWC.

Figure 7:
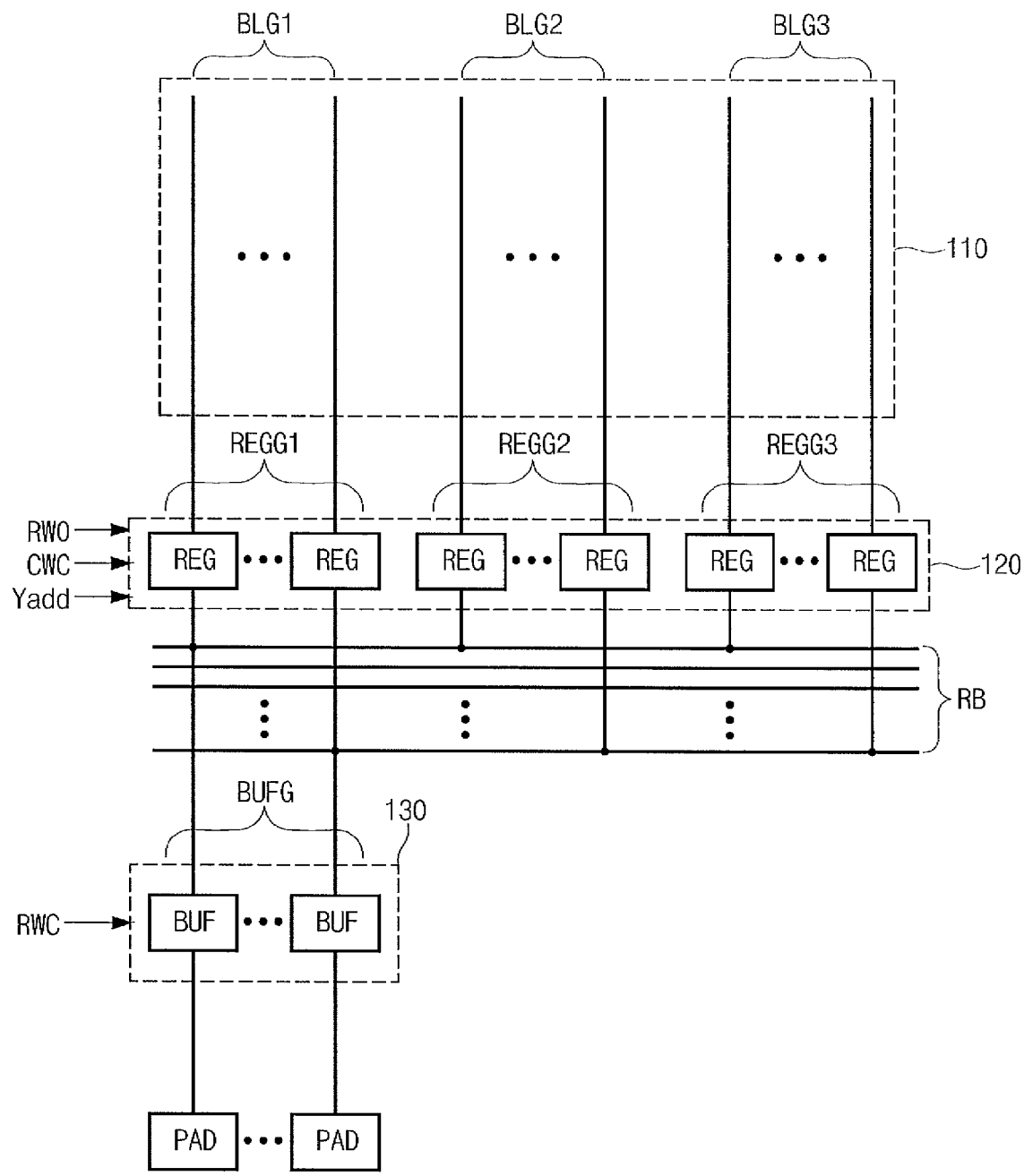
FIG. 7 is a detailed diagram illustrating a PCR cell array, a cache register and a byte-wide buffer of FIG. 5.

FIG. 7 is a detailed diagram illustrating the PCR cell array 110, the cache register 120 and the byte-wide buffer 130 of FIG. 5.

The cache register 120 includes a plurality of registers REG. Each register REG is connected one by one to the bit line BL of the PCR cell array 110.

The registers REG are connected to a register bus RB. The registers REG are connected to a plurality of buffers BUF through the register bus RB. Each buffer BUF is connected one by one to an input/output pad PAD.

A plurality of bit lines BL are divided into bit line groups BLG1~BLG3. The registers REG are divided into register groups REGG1~REGG3. The buffers BUF include one buffer group BUFG.

The bit line groups BLG1~BLG3 are connected one by one to the register groups REGG1~REGG3. The register groups REGG1~REGG3 are connected so that they share the register bus RB.

The registers REG included one register group REGG are connected to a different register bus RB, respectively. The register groups REGG1~REGG3 share one buffer group BUFG. That is, the number of the register groups REGG1~REGG3 is greater by n times than that of the buffer groups BUFG.

Figure 8:
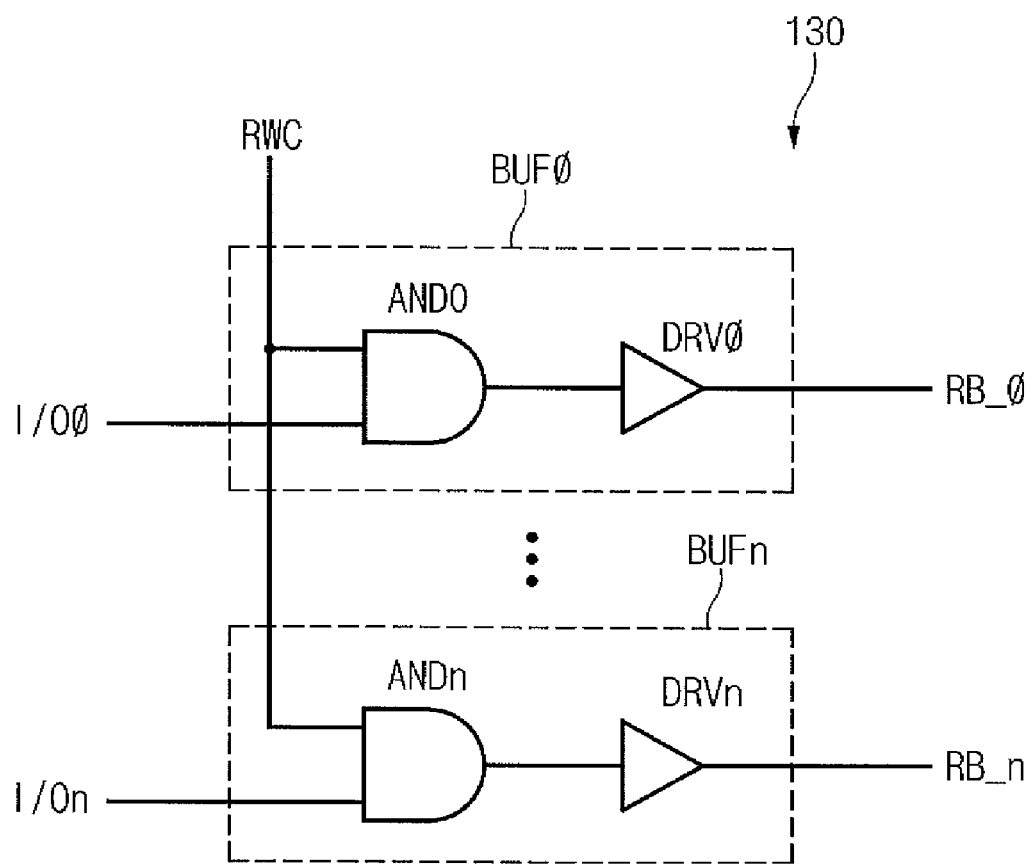
FIG. 8 is a detailed diagram illustrating a byte-wide buffer of FIG. 7.

FIG. 8 is a detailed diagram illustrating the byte-wide buffer is 130 of FIG. 7.

The byte-wide buffer 130 includes the buffer group BUFG having a plurality of buffers BUF0~BUFn. The buffer BUF0 includes an AND gate AND0 and a driving unit DRV0. The buffer BUFn includes an AND gate ANDn and a driving unit DRVn.

The AND gate AND0 performs an AND operation on the register write command RWC and data of the input/output line I/O0. The driving unit DRV0 drives an output signal of the AND gate AND0 to output the output signal to the register bus RB_0.

The AND gate ANDn performs an AND operation on the register write command RWC and the data of the input/output line I/On. The driving unit DRVn drives an output signal of the AND gate ANDn to output the output signal to the register bus RB_n.

The byte-wide buffer 130 drives data of the input/output line I/O received from the pad PAD in activation of the register write command RWC to output the data to the register bus RB.

Figure 9:
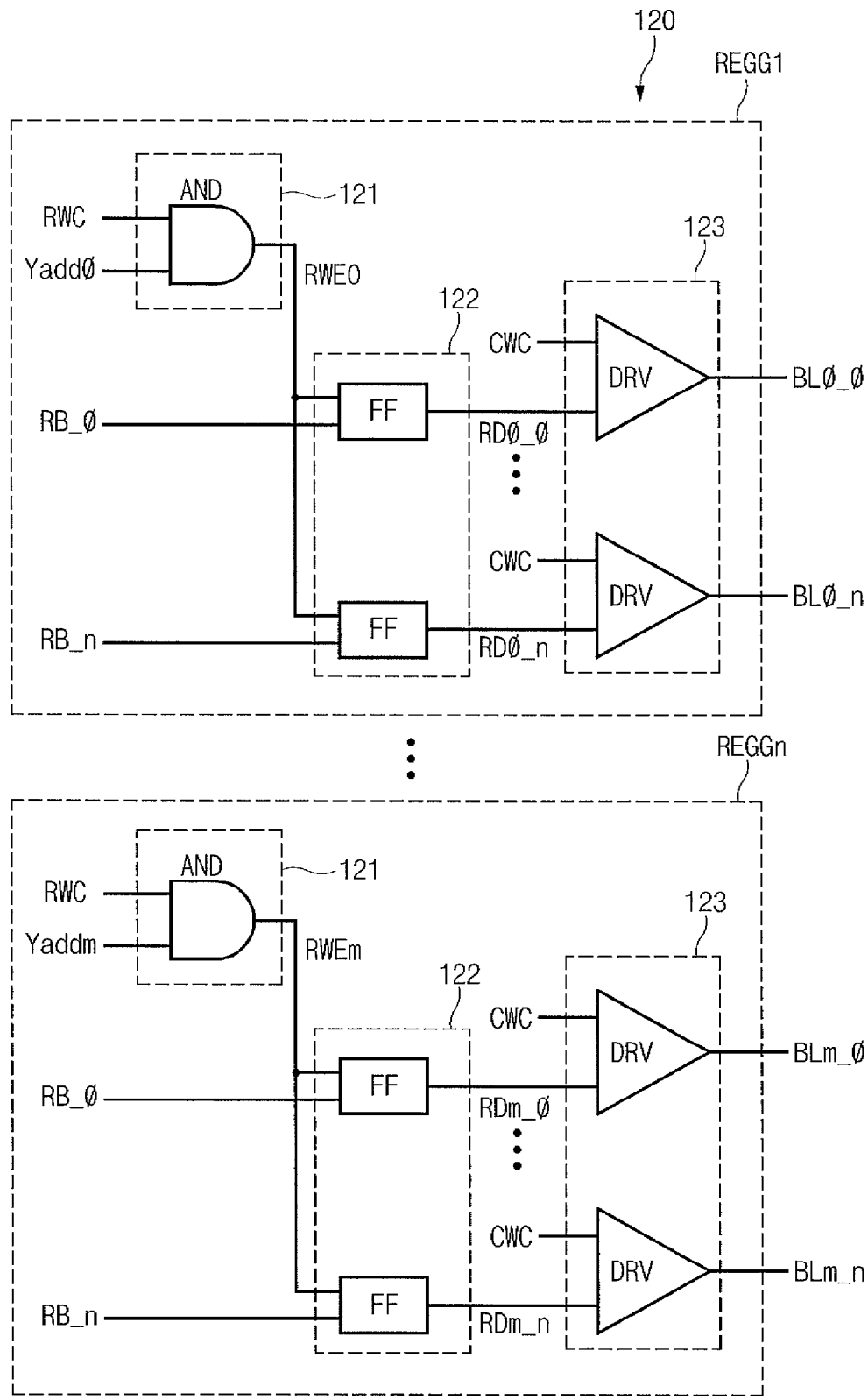
FIG. 9 is a detailed circuit diagram illustrating a cache register of FIG. 7.

FIG. 9 is a detailed circuit diagram illustrating the cache register 120 of FIG. 7.

The cache register 120 includes the register group REGG having a plurality of registers REG. The register group REGG includes a write adjusting unit 121, a data storage unit 122 and a driving adjusting unit 123.

The write adjusting unit 121 includes an AND gate AND. The AND gate AND performs an AND operation on the register write command RWC and the column address Yadd to output a write enable signal RWE. The data storage unit 122 stores data received from the register bus RB in response to the write enable signal RWE. The data storage unit 122 includes a flip-flop FF.

The driving adjusting unit 123 includes a plurality of drivers DRV. The driving unit 123 drives data RD received from the data adjusting unit 122 in response to the write command RWC to output the data RD to the bit line BL.

The register groups REGG1~REGGn receives the register write command RWC in common. However, the register groups REGG1~REGGn receive different column addresses Yadd0~Yaddm. As a result, one of the register groups REGG1~REGGn is activated by one selected from the column addresses Yadd0~Yaddm.

When the register write command RWC and the column address Yadd0 are activated in one selected register group REGG1, the write enable signal RWE0 is activated. When the write enable signal RWE0 is activated, the data storage unit 122 stores data received from the register buses RB_0~RB_n simultaneously.

The driving adjusting unit 123 outputs output data RD0_0~RD0_n of the data storage unit 122 simultaneously to the bit lines BL0_0~BL0_n in activation of the register write command RWC. The data RD is outputted to the bit line BL in each register group REGG in activation of the register write command RWC.

Figure 10:
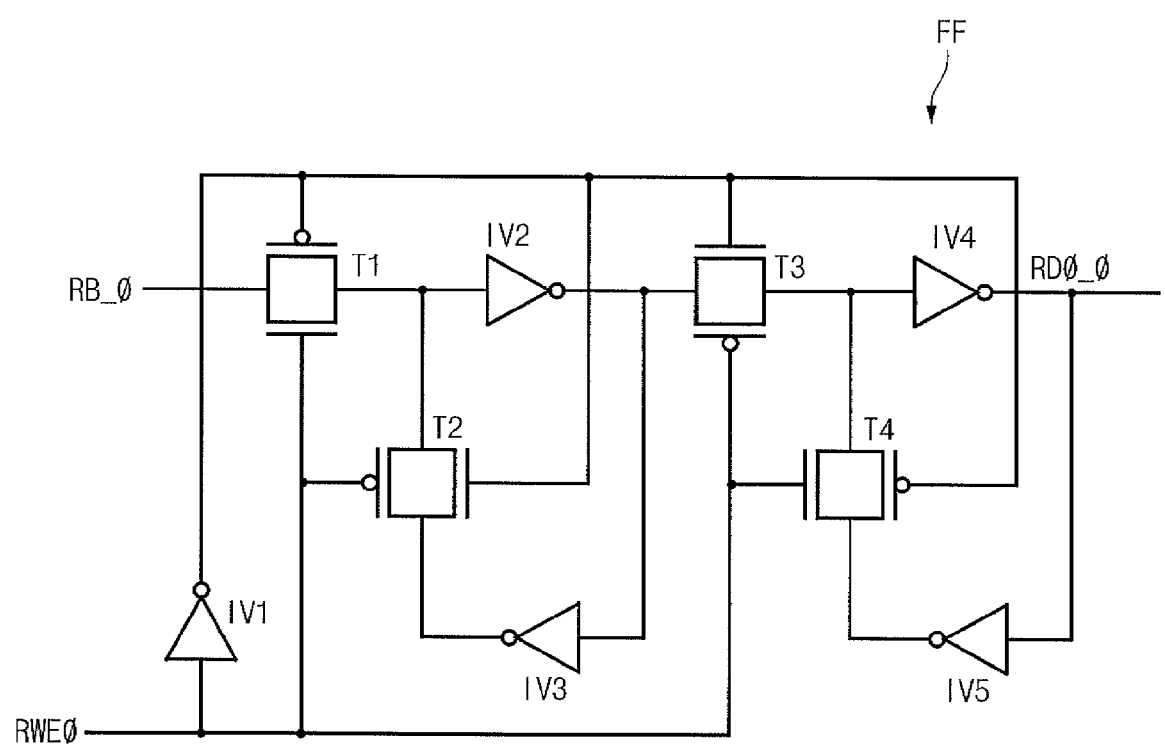
FIG. 10 is a detailed circuit diagram illustrating a flip-flop of FIG. 9.

FIG. 10 is a circuit diagram illustrating the flip-flop FF of FIG. 9.

The flip-flop FF includes a plurality of transmission gates T1~T4 and a plurality of inverters IV1~IV5.

The transmission gate T1 selectively outputs data received from the register bus RB_0 in response to the write enable signal RWE0. The transmission gate T2 selectively outputs an output signal of the inverter IV3 in response to the write enable signal RWE0.

The transmission gate T3 selectively outputs an output signal of the inverter IV2 in response to the write enable signal RWE0. The transmission gate T4 selectively outputs an output signal of the inverter IV5 in response to the write enable signal RWE0.

In the flip-flop FF, the transmission gate T1 is complementarily operated with the transmission gate T3. That is, when the write enable signal RWE0 is at a high level state, the transmission gate T1 is turned on and the transmission gate T3 is turned off. In this state, data received from the register bus RB_0 is stored in a latch consisting of the inverters IV2, IV3.

On the other hand, when the write enable signal RWE0 is at a low level state, the transmission gate T3 is turned on and the transmission gate T1 is turned off. In this state, output data of the inverter IV2 is stored in a latch consisting of the inverters IV4, IV5.

Figure 11:
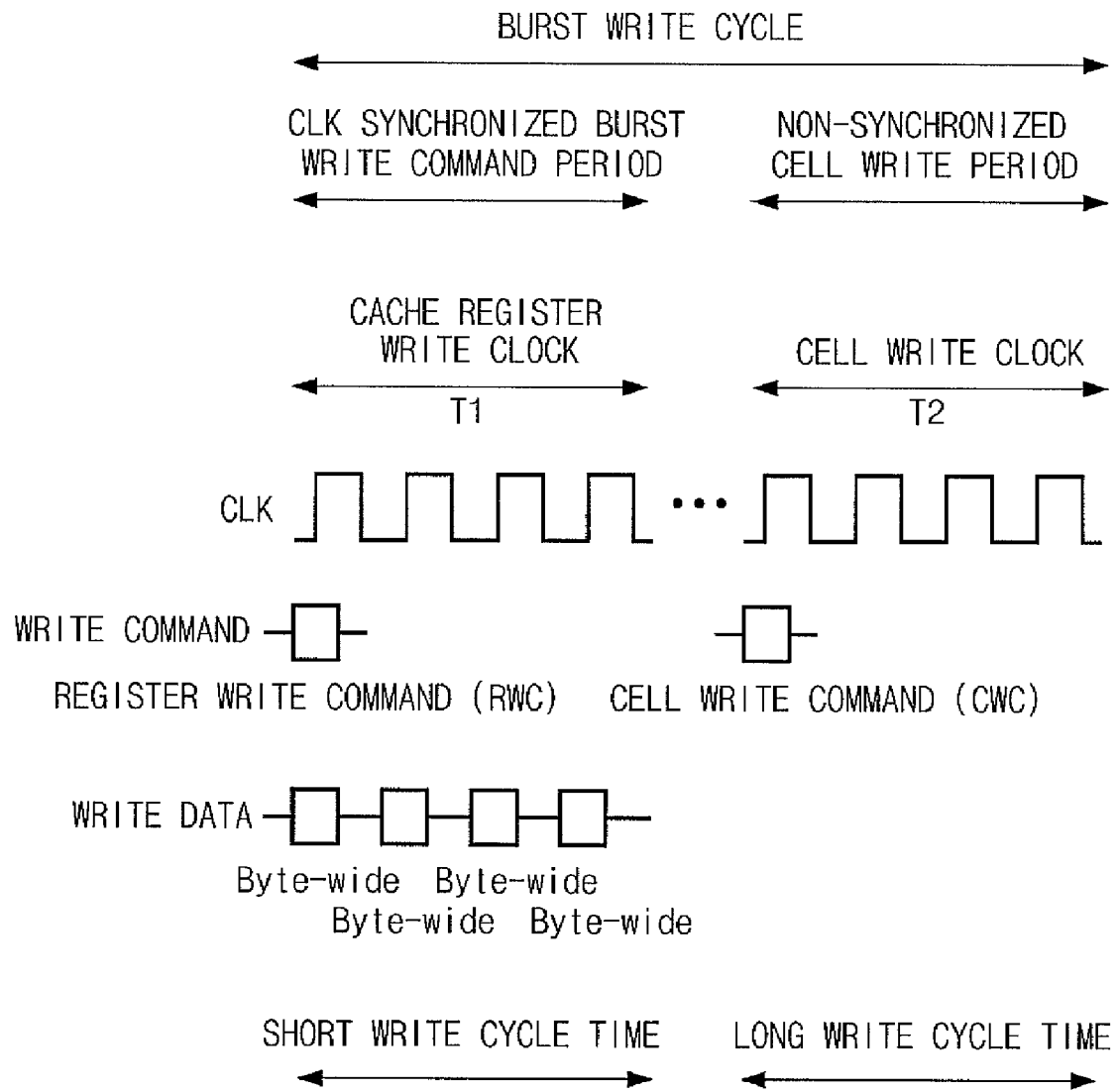
FIGS. 11 and 12 are diagrams illustrating a write cycle of a phase change memory device according to an embodiment of the present invention.
Figure 12:
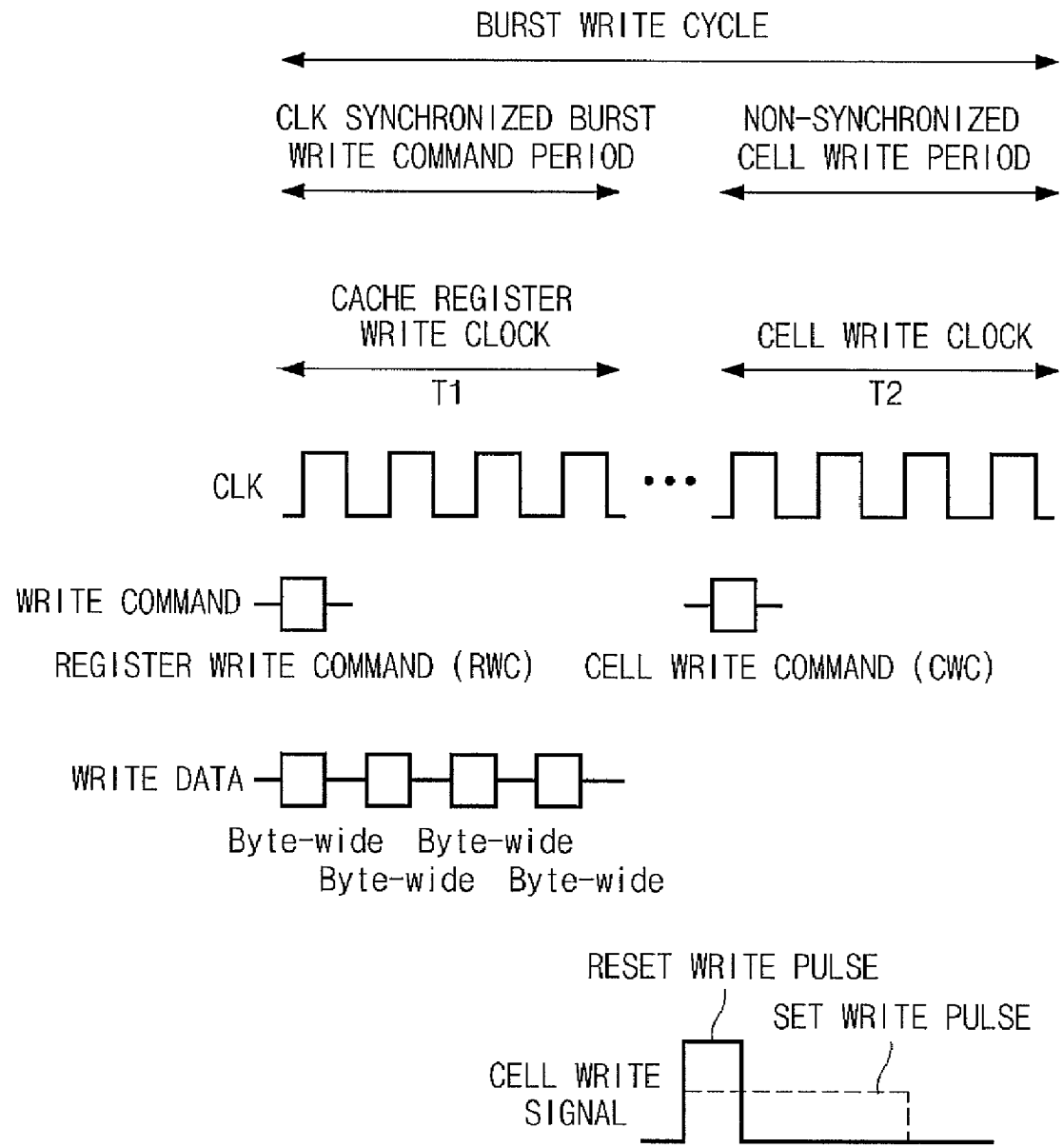

FIGS. 11 and 12 are diagrams illustrating a write cycle of a phase change memory device according to an embodiment of the present invention.

In a burst write cycle, data having a byte width is inputted with each clock and stored in the cache register 120.

During a cache register write clock period (T1), after the register write command RWC is received, a plurality of byte-wide write data are written in the cache register 120. The byte-wide write data are synchronized with a clock CLK and sequentially written in the cache register 120.

During a cell write clock period (T2), after the cell write command CWC is received, the byte-wide write data are simultaneously written in the phase change resistor PCR.

When the cache register 120 reaches a limit capacity of data that can be stored in a write region of the cache register 120, data stored in the cache register 120 are simultaneously written in phase change resistor cells using the cell write command CWC.

That is, when a current flows between a top electrode and a bottom electrode in the phase change resistor PCR of the PCR cell array 110 for a given time, heat is generated. As a result, the phase change layer either becomes crystalline or amorphous depending upon the induced temperature driven by the top electrode and the bottom electrode.

When a low current flows for a given time, the phase change layer becomes crystalline because the relative low induced temperature allows for an gentle annealing condition. Accordingly, the relatively low induced temperature results in the phase change resistor becoming a relatively low resistor and thereby produces a set state. On the other hand, when a high current flows for a given time, the phase change layer becomes amorphous because the relatively high induced temperature provides for a more rapid annealing condition. Accordingly, the relatively high induced temperature results in the phase change resistor becoming a relatively high resistor and thereby produces a reset state. As a result, this solid state phase difference between the crystalline and amorphous solid states exhibit is responsible for the electric resistance change.

When a cell write signal is activated in the write mode, a low voltage is applied to the phase change resistor for a long time in order to write the set state, i.e., crystalline state. When the cell write signal is activated in the write mode, a high voltage is applied to the phase change resistor for a short time in order to write the reset state, i.e., amorphous state.

Accordingly, the n byte-wide data are simultaneously written in the phase change resistance cell to reduce the cell write operating time by 1/n, as compared to conventional methodologies. Also, the register write command RWC is separated from the cell write command CWC, so that the byte-width of data that can be simultaneously written is adjustable desirably.

Figure 13:
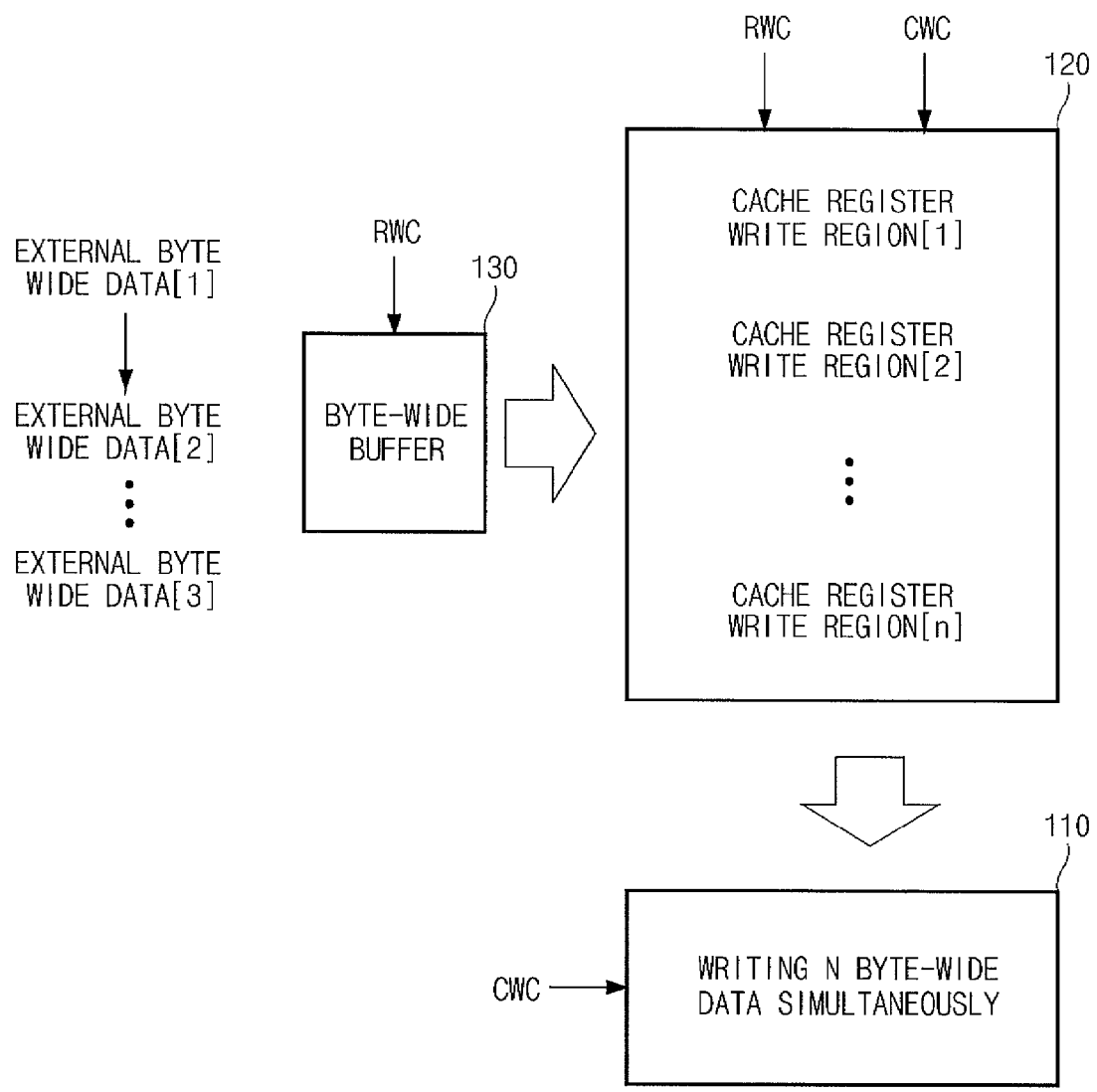
FIG. 13 is a diagram illustrating a write cycle of a phase change memory device according to an embodiment of the present invention.

FIG. 13 is a diagram illustrating a write cycle of a phase change memory device according to an embodiment of the present invention.

The write command RWC for storing data in the cache register 120 is separated from the cell write command CWC for storing data in the PCR cell array 110.

During a cache register write clock period (T1), after the register write command RWC is applied to the byte-wide buffer 130 and the cache register 120, a plurality of byte-wide write data which are externally received are sequentially stored in the register REG of the cache register 120 through the byte-wide buffer 130. The byte-wide write data are buffered through the byte-wide buffer 130.

In a first clock, an external byte-wide data 1 is stored in a cache register write region 1 of the cache register 120 by the register write command RWC. In a second clock, an external byte-wide data 2 is stored in the cache register write region 2 of the cache register 120. In a nth clock, an external byte-wide data n is stored in the cache register write region n of the cache register 120.

The byte-wide data are sequentially stored in the cache register 120 in response to the register write command RWC, so that the data can be written within a short write cycle.

The number of byte-wide data that can be written simultaneously is set, and the write region of the cache register 120 is adjusted to improve efficiency of the system.

When the cache register 120 reaches to a limit capacity of data that can be stored in the write region of the cache register 120, the cell write command CWC is activated. When the cell write command CWC is activated, the byte-wide write data stored in the cache register 120 are transmitted to the PCR cell array 110 during a cell write clock period (T2).

That is, data having N byte-widths are simultaneously written in each cell of the PCR cell array 100 by the cell write command CWC. For example, when the data width is ×8, the number of data bits that can be received externally at once is 8 bits (1 Byte). When the write cycle is repeated N times, data of N×8 may be stored in the cache register 120.

The data having N bytes are stored in the cache register 120. The data having N bytes are simultaneously written in the PCR cell array 110 through the bit line in response to the cell write command CWC.

As described above, according to an embodiment of the present invention, a phase change memory device writes a plurality of byte wide data simultaneously in cells to reduce a write operating time.

In the phase change memory device, a register write command is separated from a cell write command to adjust a byte-width of data that can be simultaneously written, thereby improving efficiency of the system.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combinations arrangement within the scope of the disclosure, the drawings and the appended claims. In addition to variations and modifications in the component parts and/or arrangements, alternative uses will also be apparent to those skilled in the art.

What is claimed is:

1. A phase change memory device comprising:
   a cache register configured to store a plurality of data applied externally in response to a register write command wherein the register write command is synchronized with a clock and to simultaneously output the plurality of data inactivation of a cell write command; and
   a phase change resistance cell array comprising phase change resistors configured to sense a change in crystallization as a function of applied currents so as to store data corresponding to resistance change and to simultaneously store the plurality of data outputted from the cache register in activation of the cell write command regardless of the clock, wherein a byte-width of data stored simultaneously depending on the cell write command is adjusted.

2. The phase change memory device according to claim 1, further comprising a buffer configured to sequentially buffer the plurality of data as a function of the register write command so as to output the data to the cache register.

3. The phase change memory device according to claim 2, wherein the cache register includes a plurality of register groups configured to the sequentially buffered plurality of data.

4. The phase change memory device according to claim 3, further comprising a register bus connected between the plurality of register groups and the buffer.

5. The phase change memory device according to claim 4, wherein the plurality of register groups share the register bus.

6. The phase change memory device according to claim 4, wherein the buffer includes one buffer group.

7. The phase change memory device according to claim 6, wherein the buffer group is shared by the plurality of register groups.

8. The phase change memory device according to claim 6, wherein the buffer group drives data applied from input/output pads in response to the register write command to output the data to the register bus with a byte-width unit.

9. The phase change memory device according to claim 4, wherein a bit line of the phase change resistance cell array includes a plurality of bit line groups.

10. The phase change memory device according to claim 9, wherein the bit line groups are connected one by one to the plurality of register groups.

11. The phase change memory device according to claim 4, wherein each register group is connected to a different register bus line.

12. The phase change memory device according to claim 4, wherein one register group selected from the plurality of register groups by a column address is activated in response to the register write command.

13. The phase change memory device according to claim 4, wherein each of the register group comprises:
   a column write adjusting unit configured to activate a write enable signal in response to the register write command and the column address;
   a data storage unit configured to store a plurality of data received from the register bus in response to the write enable signal; and
   a driving adjusting unit configured to drive the plurality of data in response to the cell write command so as to output the data to the bit line.

14. The phase change memory device according to claim 13, wherein the data storage unit includes a flip-flop.

15. The phase change memory device according to claim 1, wherein the cell write command is activated when the command reaches the limit capacity where data can be stored in the cache register.

* * * * *